US011281300B2

(12) United States Patent
Wang et al.

(10) Patent No.: US 11,281,300 B2
(45) Date of Patent: Mar. 22, 2022

(54) MULTI-MODAL HAPTICS INTEGRATED FEEDBACK HANDLE

(71) Applicant: BEIHANG UNIVERSITY, Beijing (CN)

(72) Inventors: Dangxiao Wang, Beijing (CN); Yuru Zhang, Beijing (CN); Qiqi Guo, Beijing (CN); Yijie Gong, Beijing (CN)

( * ) Notice: Subject to any disclaimer, the term of this patent is extended or adjusted under 35 U.S.C. 154(b) by 0 days.

(21) Appl. No.: 17/262,747

(22) PCT Filed: Oct. 23, 2018

(86) PCT No.: PCT/CN2018/111460
§ 371 (c)(1),
(2) Date: Jan. 25, 2021

(87) PCT Pub. No.: WO2020/019545
PCT Pub. Date: Jan. 30, 2020

(65) Prior Publication Data
US 2021/0141459 A1  May 13, 2021

(30) Foreign Application Priority Data

Jul. 27, 2018 (CN) .......................... 201810843718.5

(51) Int. Cl.
*G06F 3/01* (2006.01)
*H01L 35/32* (2006.01)
*A63F 13/245* (2014.01)
(52) U.S. Cl.
CPC ............ *G06F 3/016* (2013.01); *A63F 13/245* (2014.09); *H01L 35/32* (2013.01)
(58) Field of Classification Search
None
See application file for complete search history.

(56) References Cited

U.S. PATENT DOCUMENTS

2010/0225456 A1* 9/2010 Eldering ................. G06F 3/016
340/407.2
2011/0007035 A1* 1/2011 Shai ...................... G06F 3/0338
345/179
(Continued)

FOREIGN PATENT DOCUMENTS

CN           105117016 A      12/2015
CN           107092344 A       8/2017
(Continued)

OTHER PUBLICATIONS

International search report of PCT/CN2018/111460.
(Continued)

*Primary Examiner* — Carl Adams

(57) ABSTRACT

Disclosed is a multi-tactile fusion feedback handle, characterized in that the handle comprises three areas, namely, a finger tactile function area, a palm tactile function area and a space positioning function area. The finger tactile function area comprises one or more tactile buttons, a finger can operate the tactile buttons alone or in combination, and the tactile buttons have feedback functions for one or more kinds of tactility, namely, softness, temperature, surface friction and texture, and shape. The palm tactile function area comprises a multi-point independent vibration source and/or a multi-point independent heat source, which can be used for multi-point independent vibration feedback and/or multi-point independent temperature feedback, as well as vibration flow and heat flow feedback. The space positioning function area comprises a space positioning module, which can obtain position information of the handle in space in real time. Compared with a traditional various discrete-type tactile feedback apparatus, the present invention gives a user a complete and realistic composite tactile experience in a
(Continued)

virtual scene, and the handle is feasible in integration and convenient for holding.

7 Claims, 2 Drawing Sheets

(56) References Cited

U.S. PATENT DOCUMENTS

| | | | | |
|---|---|---|---|---|
| 2017/0235364 | A1* | 8/2017 | Nakamura | G06F 3/014 345/156 |
| 2017/0329440 | A1 | 11/2017 | Sturm et al. | |
| 2018/0116601 | A1* | 5/2018 | Yi | A61B 18/1477 |
| 2019/0009172 | A1* | 1/2019 | Sawai | A63F 13/245 |

FOREIGN PATENT DOCUMENTS

| CN | 107636605 A | 1/2018 |
|---|---|---|
| EP | 2123537 A1 | 11/2009 |

OTHER PUBLICATIONS

First Office Action from The State Intellectual Property Office of People's Republic of China.
Second Office Action from The State Intellectual Property Office of People's Republic of China.
Third Office Action from The State Intellectual Property Office of People's Republic of China.

* cited by examiner

MULTI-MODAL HAPTICS INTEGRATED FEEDBACK HANDLE

CROSS-REFERENCE TO RELATED APPLICATIONS

The present application claims priority from Chinese patent application No. 201810843718.5, filed with the Chinese National Intellectual Property Administration on Jul. 27, 2018 and entitled "Multi-modal Haptics Integrated Feedback Handle", the entire content of which is incorporated herein by reference.

FIELD OF THE INVENTION

The present disclosure relates to a feedback handle; in particular, the present disclosure relates to a multi-modal haptics integrated feedback Handle.

BACKGROUND OF THE INVENTION

Incorporating haptics into a virtual reality environment can enrich an interactive experience of a virtual reality system, such as allowing users to feel haptic information of commodities such as clothes in a virtual shopping scene, or to feel various physical properties of objects in a VR game more realistically through simulation, such as softness, changes between low and high temperatures, object surface friction or texture, etc. However, existing haptics feedback devices currently in the related art are mostly single-modal haptics feedback devices, such as a single-vibration feedback device or a single-temperature feedback device.

Therefore, in order to achieve the integration and compositeness of haptics in the real world, it is desired to realize a composite sensation of multi-modal haptics integrated feedback on the same device. Therefore, it is necessary to develop a haptics feedback device in which various haptics, such as temperature, vibration, softness, friction, texture and the like are integrated together.

At present, existing haptics feedback devices in the related art are mostly single-modal haptics feedback devices, such as a single-vibration feedback device or a single-temperature feedback device. There lacks a haptics integrated feedback device in which various haptics, such as temperature, vibration, softness, friction, texture and the like are integrated together.

SUMMARY OF THE INVENTION

An object of the present disclosure is to overcome the defects of the related art and provide a multi-modal haptics integrated feedback handle.

The following technical solution is provided by the present disclosure: a multi-modal haptics integrated feedback handle, which includes three areas: a finger haptics function area, a palm haptics function area, and a spatial positioning function area; wherein the finger haptics function area includes one or more haptic buttons, and fingers can operate the haptic buttons individually or jointly; the haptic buttons have feedback functions of one or more haptics of softness, temperature, surface friction and texture, and shape; the palm haptics function area includes multi-point independent vibration sources and/or multi-point independent heat sources, which can perform multi-point independent vibration feedbacks and/or multi-point independent temperature feedbacks, as well as vibration flow feedbacks and heat flow feedbacks; and the spatial positioning function area includes a spatial positioning module, which can obtain position information of the handle in the space in real time.

Further, the haptic buttons include one or more of a surface friction and texture haptic feedback device, a temperature haptic feedback device, a softness haptic feedback device, and a shape haptic feedback device. The surface friction and texture haptic feedback device comprises an electrostatic effect film, the temperature haptic feedback device comprises a flexible thermally conductive metal film, the softness haptic feedback device comprises a silicone cavity, and the shape haptic feedback device includes a miniature motor.

Further, the vibration sources comprise miniature vibration motors, and the heat sources comprise thermoelectric semiconductor cooling assemblies, that is, Peltier patches.

Further, the haptic buttons also include a device for measuring finger position information, and the device for measuring finger position information comprises a miniature camera or a flexible screen.

The present disclosure has the following advantageous effects: the various haptic systems in the related art are usually separate and incomplete, which usually only have a single local vibration sensation, a single local heat source sensation and some scattered haptic experiences; what the present disclosure achieves is an integrated feedback of multiple haptics on one handle, including haptics feedbacks from a thumb haptic button function area in terms of the softnesses, surface frictions, textures, and temperatures of the thumb and the index finger. These haptics feedbacks are all integrated on the same one button, thus giving users a more realistic and a rich composite experience; the palm haptics function area aims at the haptics of the palm, the middle finger, the ring finger, and the little finger. Through the spatial arrangement and regular control of multiple vibration motors and Peltier patches, not only single vibration sensation and single temperature sensation at each sensitive position are realized, but also a continuous temperature heat flow experience and a continuous vibration flow experience are realized; when combined with the positioning module, users will be given a complete and fully realistic composite haptics experience in a virtual scene on the same handle. A highly integrated composite haptics feedback handle is provided, which, as compared with traditional split-type haptics feedback devices, has the advantages of high integration and convenient holding, etc.

DETAILED DESCRIPTION OF THE EMBODIMENT(S) OF THE INVENTION

Figure 1:
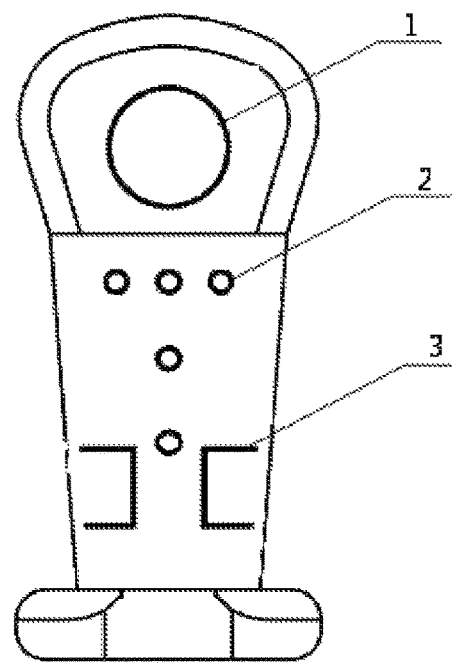
FIG. 1 is a schematic structural view of a feedback handle.
Figure 2:
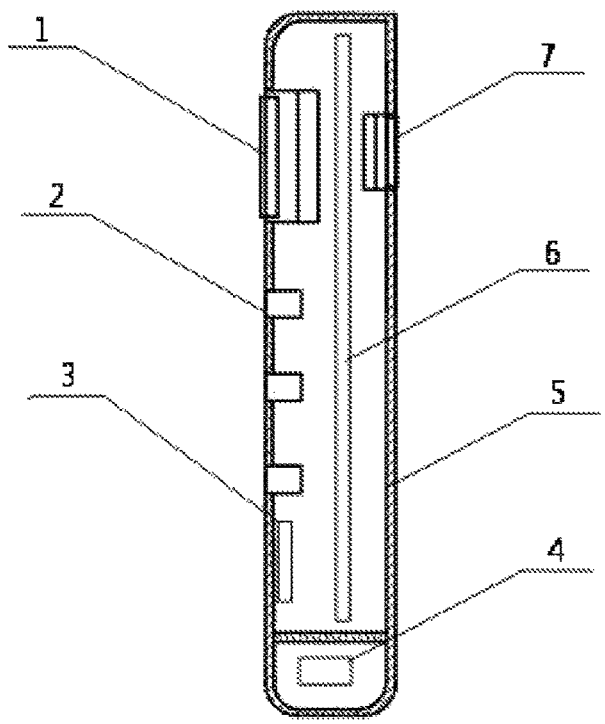
FIG. 2 is a side sectional view of the feedback handle.

The technical solutions of the present disclosure will be clearly and fully described below with reference to the accompanying drawings. Obviously, the described embodiments are only some of the embodiments of the present disclosure, not all of them. Based on the embodiments of the present disclosure, all other embodiments obtained by those skilled in the art without creative work shall fall within the scope of protection of the present disclosure.

It should be noted that in the description of the present disclosure, directional or positional relationships indicated by terms such as "center", "upper", "lower", "left", "right", "vertical", "horizontal", "inner" and "outer" are based on the directional or positional relationships shown in the drawings. They are merely used for the convenience of simplified description of the present disclosure, and do not indicate or imply that the device or element involved must have a specific orientation, or be configured or operated in a specific orientation. Therefore, they should not be construed as limiting the present disclosure. In addition, terms "first", "second" and "third" are used for descriptive purpose only, and should not be construed as indicating or implying relative importance.

It should be noted that in the description of the present disclosure, unless otherwise clearly specified and defined, terms "install", "connect" and "communicate" should be understood in a broad sense; for example, the connection may be a fixed connection, or may also be a detachable connection, or an integral connection; it may be a mechanical connection, or may also be an electrical connection; it may be a direct connection, or an indirect connection implemented through an intermediate medium, or it may be an internal communication between two elements. For those skilled in the art, the specific meaning of the above terms in the present disclosure can be understood according to specific situations.

Referring to FIG. 1, a multi-modal haptics integrated feedback handle is shown, which includes three areas: a finger haptics function area, a palm haptics function area, and a spatial positioning function area; wherein feedback functions of four haptics, i.e., softness, temperature, surface friction and texture, and shape, are integrated into the finger haptics function area, so that an integrated effect of the four haptics can be simulated; the finger haptics function area includes haptic buttons, and fingers can operate the haptic buttons individually or jointly; the palm haptics function area has functions of multi-point independent vibration feedbacks and multi-point independent temperature feedbacks; and the spatial positioning function area includes a spatial positioning module, which can obtain position information of the handle in the space in real time.

Figure 3:
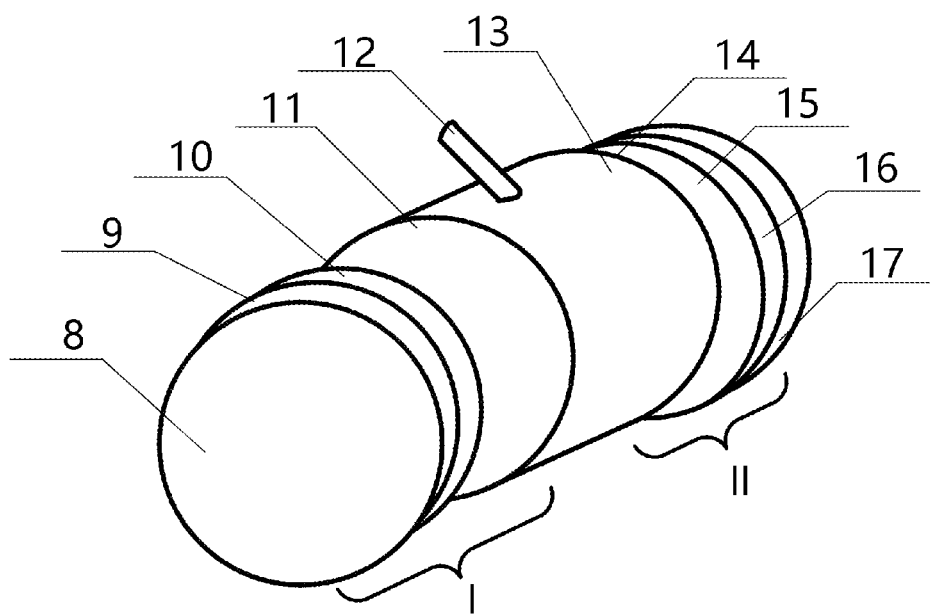
FIG. 3 is a schematic structural view of haptic buttons.
wherein the above drawings include the following reference signs: 1. first haptic button; 2. vibration motor; 3. Peltier patch; 4. spatial positioning module; 5. housing; 6. control circuit board; 7. second haptic button; 8. first electrostatic effect film; 9. first flexible thermally conductive metal film; 10. first flexible screen; 11. first surface of silicone cylinder; 12. gas passage; 13. silicone cylinder; 14. second surface of silicone cylinder; 15. second flexible screen; 16. second flexible thermally conductive metal film; 17. second electrostatic effect film.

The finger haptics function area includes two haptic buttons located on a head of the handle, and upper and lower surfaces of the head of the handle each has one of the haptic buttons located thereon at coaxial positions. The two haptic buttons have the same function and structure, and differ from each other only in terms of the area and volume so as to cope with the difference in finger size. The structural view of the haptic buttons is shown in FIG. 3, wherein I and II respectively represent configurations of a first haptic button 1 and a second haptic button 7 on the head of the handle; the first haptic button 1 and the second haptic button 7 respectively include: a first electrostatic effect film 8 and a second electrostatic effect film 17, which are used for haptics feedback of surface friction and texture; a first flexible thermally conductive metal film 9 and a second flexible thermally conductive metal film 16, which are used for haptics feedback of temperature; a silicone cylinder, which is used for haptics feedback of softness, wherein a cylindrical cavity of the silicone cylinder is provided with a gas passage 12 for gas exchange; the surfaces of the haptic buttons are each formed by pressing and integrating four layers of different films, and functions of the various layers are kept independent from each other; cylinder surface driving boards are installed in area I and area II respectively so as to drive the first haptic button 1 and the second haptic button 7 to tilt at certain angles.

Haptics feedback of softness: by taking advantage of the characteristics of easy molding and good flexibility of silicone, the silicone is cast into a cylinder-like shape, wherein upper and lower top circles of the cylinder are respectively coplanar with the upper and lower buttons on the head of the handle; the silicone cylinder is connected to the outside only through a silicone gas passage tube to realize the increase and decrease of the gas inside the cylinder to change the gas pressure. The silicone gas passage is connected to a miniature gas pump, and the miniature gas pump is controlled by a single-chip microcomputer to further control the amount of gas in the silicone cylinder, thereby changing the flexibility of the silicone cylinder. If the user presses the upper and lower top circles of the silicone cylinder with fingers, he/she can feel the softness of the virtual object.

Haptics feedback of surface friction and texture: under the principle of electrostatic vibration, electrostatic effect films are used and applied a voltage signal having a specific changing pattern, and the system composed of the electrostatic films and the human finger will produce an electrostatic vibration effect on the fingertip contact surface, so that people can feel the effect of increased friction on the surfaces of the films to simulate the friction and texture of the surface of the object. An amplifying circuit is controlled by the single-chip microcomputer to generate a voltage signal (voltage amplitude, frequency and phase) having a certain changing pattern, and the signal is loaded on the electrostatic films so that the user can feel the changing frictional hindrance effect and the surface texture features of the object on the films to simulate the haptics of hand touch when the user sees and touches different objects in the virtual scene. The electrostatic films are installed on the surface of the two buttons. Due to the characteristics of the films themselves, they will not affect the softness sensed by the user.

Haptics feedback of temperature: the temperature sources are also Peltier patches; however, due to the limited space of the buttons on the head of the handle, the Peltier patches cannot directly contact the two buttons, since the problem of spatial interference between the Peltier patches and the soft silicone cylinder is difficult to solve. Therefore, the Peltier patches are used as heat sources, and the flexible and soft metal films with good thermal conductivity absorb heat after thermal conduction, so that the temperatures of the surfaces of the buttons can be effectively controlled. Therefore, by controlling the amplitude and time of the energized voltage of an amplifying circuit of the Peltier patches by the single-chip microcomputer, the temperatures of the surfaces of the buttons can be controlled, so that the user can have temperature perception of the rough surface of the object, and even physical phenomena such as heat generation by friction can be simulated.

Haptics feedback of shape: through a structural design, a miniature motor drives rigid parts of side walls of the buttons to tilt the cylinder surfaces of the two buttons at certain angles, so that objects of different shapes can be felt through simulation by touching and sliding with the thumb and the index finger at the same time.

The haptic buttons also include a device for measuring position information of the finger. A first flexible screen 10 and a second flexible screen 15 are used to feedback the position information of the finger; the material of the flexible screens is preferably graphene, and the flexible screens may also be replaced by miniature cameras.

The palm haptics function area includes multi-point independent vibration sources and multi-point independent heat sources; the multi-point independent vibration sources are five to six flat miniature vibration motors each having the size of a button, which are installed on the handle at corresponding positions where the palm center and fingertips are sensitive to vibrations, namely, the generated vibrations can be sensed by the user's palm and three fingers (the middle finger, the ring finger, and the little finger); by designing the installation positions of several vibration motors, and controlling the intensity (that is, controlling the amplitude of voltage across the motor load) and time (energization frequency) of the vibration of each motor separately through programming of the single-chip microcomputer, the installation arrangement of several motors can produce a certain regular vibration. The overall effect is to give users an intuitive experience of vibration flow. Single driving of a motor enables users to experience a local vibration sensation and achieves touch experience of a single vibration sensation at a different position on the hand.

The multi-point independent heat sources are multiple thermoelectric semiconductor cooling assemblies, i.e., Peltier patches. The Peltier patch refers to a semiconductor device physically divided into two sides, one side of which will absorb heat and the other side of which will dissipate heat when energized unidirectionally, that is, the two sides produce cold and hot effects respectively; in the present disclosure, the reference direction of the positive and negative voltages of power supply of the Peltier patch is changed to achieve the effect of producing cold and hot effects on the same physical side of the Peltier patch. By rationally designing installation positions of multiple Peltier patches, and sensing by the user's palm and three fingers (the middle finger, the ring finger and the little finger) that are most sensitive to thermal stimulation, the user can experience the hot effect of local temperature rise or the cold effect of local temperature drop at different positions of the palm and fingers, so that the haptics in the scenes such as the user holding an ice block in the palm or the user's finger approaching the fire in a virtual environment can be simulated; similarly, a power amplifying circuit is controlled by single-chip microcomputer programming to control the amplitude and energization time of the power supply voltage of the Peltier patches according to a certain frequency and sequence, so that users can have a heat flow experience similar to blowing of hot wind. Single driving of a Peltier patch enables users to experience a local hot feeling and achieves touch experience of a single hot feeling at a different position on the hand.

The vibration motors 2 and the Peltier patches 3 are installed on the inner surface of the housing 5 in the middle of the handle at certain spatial positions.

The spatial positioning function area includes a handle base, and a control positioning module 4 is installed in the base. The six-degree-of-freedom spatial positioning of the handle is realized through wireless transmission. After calibration by dual locators, the position information of the handle in the space can be obtained in real time.

The entire handle is powered by a battery. A control circuit board 6 of the handle is installed inside the housing 5. The circuit board will be welded with various drive wires and power lines and is fixed in the housing 5 by screws. The single-chip microcomputer of the control system is TI's MSP430F149 super low-power 16-bit single-chip microcomputer, a drive amplifying circuit of a 5-6 way vibration motor, a power amplifying circuit of a 3-4 way Peltier patch, a gas pump power amplifying circuit of a soft silicone cylindrical cavity, a drive circuit of a friction and texture electrostatic effect film, a flexible screen drive circuit for finger position information measurement, etc. The entire handle system communicates data with the host computer through wireless communication, and a communication protocol interfaces and the like are designed.

The above described embodiments are preferred embodiments of the present disclosure, but the embodiments of the present disclosure are not limited by the above described embodiments, and any other changes, modifications, substitutions, combinations and simplifications made without departing from the spirit and principle of the present disclosure should all be taken as equivalent alternatives, which are all included in the scope of protection of the present disclosure.

What is claimed is:

1. A multi-modal haptics integrated feedback handle, comprising three areas: a finger haptics function area, a palm haptics function area, and a spatial positioning function area;
   wherein the finger haptics function area comprises one or more haptic buttons, and fingers can operate the haptic buttons individually or jointly; the haptic buttons have feedback functions of haptics of softness, temperature, surface friction and texture, and shape;
   the palm haptics function area comprises multi-point independent vibration sources and multi-point independent heat sources, which can perform multi-point independent vibration feedbacks and/or multi-point independent temperature feedbacks, as well as vibration flow feedbacks and heat flow feedbacks; and
   the spatial positioning function area comprises a spatial positioning module, which can obtain position information of the handle in the space in real time;
   the haptic buttons comprise one or more of a surface friction and texture haptic feedback device, a temperature haptic feedback device, a softness haptic feedback device, and a shape haptic feedback device;
   the softness haptic feedback device comprises a silicone cavity; the silicone cavity is provided with a gas passage for gas exchange; the gas passage is connected to a miniature gas pump.

2. The multi-modal haptics integrated feedback handle according to claim 1, wherein the haptic buttons comprise a device for measuring finger position information.

3. The multi-modal haptics integrated feedback handle according to claim 1, wherein the vibration sources comprise miniature vibration motors, and the multi-point independent heat sources comprise thermoelectric semiconductor cooling assemblies.

4. The multi-modal haptics integrated feedback handle according to claim 1, wherein the surface friction and texture haptic feedback device comprises an electrostatic effect film.

5. The multi-modal haptics integrated feedback handle according to claim 1, wherein the temperature haptic feedback device comprises a flexible thermally conductive metal film.

6. The multi-modal haptics integrated feedback handle according to claim 1, wherein the shape haptic feedback device comprises a miniature motor.

7. The multi-modal haptics integrated feedback handle according to claim 2, wherein the device for measuring finger position information comprises a miniature camera or a flexible screen.

* * * * *